(12) United States Patent
Zhu et al.

(10) Patent No.: US 11,329,114 B2
(45) Date of Patent: May 10, 2022

(54) DISPLAY SUBSTRATE AND MANUFACTURE METHOD THEREOF

(71) Applicants: Hefei Xinsheng Optoelectronics Technology Co., Ltd., Anhui (CN); BOE Technology Group Co., Ltd., Beijing (CN)

(72) Inventors: Ruhui Zhu, Beijing (CN); Gu Yao, Beijing (CN)

(73) Assignees: Hefei Xinsheng Optoelectronics Technology Co., Ltd., Anhui (CN); BOE Technology Group Co., Ltd., Beijing (CN)

( * ) Notice: Subject to any disclaimer, the term of this patent is extended or adjusted under 35 U.S.C. 154(b) by 48 days.

(21) Appl. No.: 16/767,425

(22) PCT Filed: Dec. 13, 2019

(86) PCT No.: PCT/CN2019/125133
§ 371 (c)(1),
(2) Date: May 27, 2020

(87) PCT Pub. No.: WO2020/181861
PCT Pub. Date: Sep. 17, 2020

(65) Prior Publication Data
US 2021/0202625 A1    Jul. 1, 2021

(30) Foreign Application Priority Data
Mar. 11, 2019 (CN) .......................... 201910179693.8

(51) Int. Cl.
*H01L 27/32* (2006.01)
*H01L 51/56* (2006.01)

(52) U.S. Cl.
CPC .......... *H01L 27/3246* (2013.01); *H01L 51/56* (2013.01)

(58) Field of Classification Search
None
See application file for complete search history.

(56) References Cited

U.S. PATENT DOCUMENTS

| 8,686,629 B2 | 4/2014 | Oh et al. | |
| 2005/0263757 A1* | 12/2005 | Lee | H01L 51/0011 257/40 |
| 2018/0081442 A1* | 3/2018 | Xu | G06F 3/0488 |

FOREIGN PATENT DOCUMENTS

| CN | 101097946 A | 1/2008 |
| CN | 108878689 A | 11/2018 |
| CN | 109300961 A | 2/2019 |
| KR | 20030061514 A | 7/2003 |

* cited by examiner

*Primary Examiner* — Michelle Mandala
(74) *Attorney, Agent, or Firm* — Banner & Witcoff, Ltd.

(57) ABSTRACT

A display substrate and a manufacture method thereof are provided. The display substrate includes a pixel definition layer and a controllable deformation layer; the pixel definition layer includes a plurality of openings for defining a plurality of pixel units; and the controllable deformation layer is on the pixel definition layer, and a horizontal extension of at least a portion of the controllable deformation layer in a direction parallel to the pixel definition layer is controllable. The organic functional layer of the display substrate has uniform morphology, so the display substrate has better display effect.

20 Claims, 4 Drawing Sheets

DISPLAY SUBSTRATE AND MANUFACTURE METHOD THEREOF

The application is a U.S. National Phase Entry of International Application No. PCT/CN2019/125133 filed on Dec. 13, 2019, designating the United States of America and claiming priority to Chinese Patent Application No. 201910179693.8, filed on Mar. 11, 2019. The present application claims priority to and the benefit of the above-identified applications and the above-identified applications are incorporated by reference herein in their entirety.

TECHNICAL FIELD

Embodiments of the present disclosure relate to a display substrate and a manufacture method thereof.

BACKGROUND

Organic light-emitting display devices have advantages, such as self-luminescence, fast response, wide viewing angle, high brightness, brilliant color, lightness, thinness, and the like, thus becoming an important display technology.

An organic functional layer of an organic light-emitting display device may be formed, for example, by a way of inkjet printing. In this situation, a pixel definition layer needs to be prepared on a base substrate in advance, in order to define the precise injection of an organic functional material into a designated pixel region.

SUMMARY

At least one embodiment of the present disclosure provides a display substrate, which comprises: a pixel definition layer, comprising a plurality of openings for defining a plurality of pixel units; and a controllable deformation layer on the pixel definition layer; a horizontal extension of at least a portion of the controllable deformation layer in a direction parallel to the pixel definition layer is controllable.

For example, in the display substrate provided by at least one embodiment of the present disclosure, after the controllable deformation layer extends horizontally, a cross section of the controllable deformation layer in a direction perpendicular to the pixel definition layer is an inverted trapezoid that is narrower on a side of the pixel definition layer.

For example, in the display substrate provided by at least one embodiment of the present disclosure, a material of the controllable deformation layer comprises a photo-induced deformation material.

For example, in the display substrate provided by at least one embodiment of the present disclosure, the photo-induced deformation material comprises azobenzene, benzospiropyran, copolymer containing cinnamic acid groups, or polyethylene polymer.

For example, in the display substrate provided by at least one embodiment of the present disclosure, the horizontal extension is realized by irradiating the controllable deformation layer with first light.

For example, in the display substrate provided by at least one embodiment of the present disclosure, the horizontal extension is withdrawn by removing the first light or irradiating the controllable deformation layer with second light, a wavelength range of the second light is different from a wavelength range of the first light.

For example, in the display substrate provided by at least one embodiment of the present disclosure, a material of the controllable deformation layer comprises a magnetostrictive material.

For example, in the display substrate provided by at least one embodiment of the present disclosure, the controllable deformation layer comprises a resin polymer material containing terbium-dysprosium-iron rare earth giant magnetostrictive particles.

For example, in the display substrate provided by at least one embodiment of the present disclosure, the horizontal extension is realized by applying a magnetic field to the controllable deformation layer.

For example, in the display substrate provided by at least one embodiment of the present disclosure, the horizontal extension is withdrawn by removing the magnetic field applied to the controllable deformation layer.

For example, in the display substrate provided by at least one embodiment of the present disclosure, a thickness of the controllable deformation layer is ranged from 0.5 µm to 1.5 µm.

At least one embodiment of the present disclosure provides a manufacture method of manufacturing a display substrate, which comprises: forming a pixel definition layer, the pixel definition layer comprising a plurality of openings for defining a plurality of pixel units; and forming a controllable deformation layer on the pixel definition layer; a horizontal extension of at least a portion of the controllable deformation layer in a direction parallel to the pixel definition layer is controllable.

For example, the manufacture method of manufacturing the display substrate provided by at least one embodiment of the present disclosure further comprises: filling the plurality of openings with a liquid material; drying the liquid material, and at the same time applying a first control to the controllable deformation layer, so that the controllable deformation layer extends horizontally along a direction towards the plurality of openings.

For example, in the manufacture method of manufacturing the display substrate provided by at least one embodiment of the present disclosure, after drying the liquid material, the manufacture method further comprises: controlling the controllable deformation layer to withdraw the horizontal extension of the controllable deformation layer.

For example, in the manufacture method of manufacturing the display substrate provided by at least one embodiment of the present disclosure, the applying the first control to the controllable deformation layer, comprises: controlling a size of the horizontal extension of the controllable deformation layer by changing at least one of a duration and an intensity of the first control.

For example, in the manufacture method of manufacturing the display substrate provided by at least one embodiment of the present disclosure, a material of the controllable deformation layer is a photo-induced deformation material, the first control is first light irradiation; the controlling the controllable deformation layer to withdraw the horizontal extension of the controllable deformation layer, comprises: removing the first light irradiation, or applying second light irradiation to the controllable deformation layer, a wavelength range of the second light irradiation is different from a wavelength range of the first light irradiation; and the controlling the size of the horizontal extension of the controllable deformation layer by changing the at least one of the duration and intensity of the first control, comprises: controlling the size of the horizontal extension of the controllable deformation layer by changing an irradiation duration, a light intensity, or both the irradiation duration and the light intensity of the first light irradiation.

For example, in the manufacture method of manufacturing the display substrate provided by at least one embodiment of the present disclosure, the first light irradiation is ultraviolet light irradiation and the second light irradiation is visible light irradiation.

For example, in the manufacture method of manufacturing the display substrate provided by at least one embodiment of the present disclosure, the light intensity of the first light irradiation is ranged from 20 mw/cm$^2$ to 200 mw/cm$^2$, and the irradiation duration is ranged from 5 s to 35 s.

For example, in the manufacture method of manufacturing the display substrate provided by at least one embodiment of the present disclosure, a material of the controllable deformation layer is a magnetostrictive material, the first control is a magnetic field; the controlling the controllable deformation layer to withdraw the horizontal extension of the controllable deformation layer, comprises: removing the magnetic field; and the controlling the size of the horizontal extension of the controllable deformation layer by changing the at least one of the duration and intensity of the first control, comprises: controlling the size of the horizontal extension of the controllable deformation layer by changing an acting duration of the magnetic field, an intensity of the magnetic field, or both the acting duration and the intensity of the magnetic field.

For example, in the manufacture method of manufacturing the display substrate provided by at least one embodiment of the present disclosure, the magnetic field strength is ranged from 100 KA/m to 600 KA/m, and the acting duration is ranged from 30 s to 120 s.

BRIEF DESCRIPTION OF THE DRAWINGS

In order to clearly illustrate the technical solutions of the embodiments of the present disclosure, the drawings of the embodiments will be briefly described in the following; and it is obvious that the described drawings are only related to some embodiments of the present disclosure and thus are not limitative to the present disclosure.

DETAILED DESCRIPTION

In order to make objects, technical details and advantages of the embodiments of the present disclosure apparent, the technical solutions of the embodiments will be described in a clearly and fully understandable way in connection with the drawings related to the embodiments of the present disclosure. Apparently, the described embodiments are just a part but not all of the embodiments of the present disclosure. Based on the described embodiments herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. The terms "comprise," "comprising," "comprise," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may comprise an electrical connection, directly or indirectly. "On," "under," "right," "left" and the like are only used to indicate relative position relationship, and when the position of the object which is described is changed, the relative position relationship may be changed accordingly.

Figure 1:
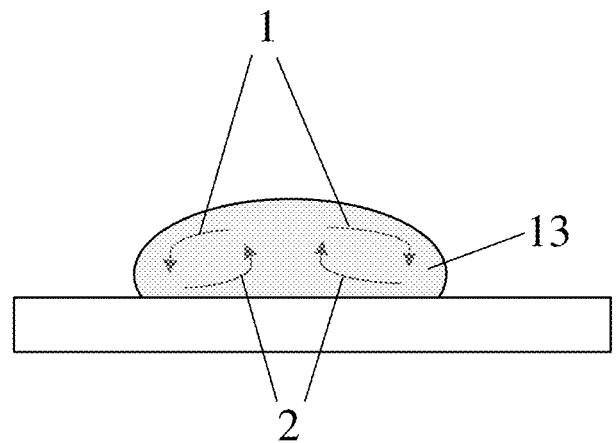
FIG. 1 is a schematic diagram of a morphology of a liquid droplet on a display substrate.
Figure 2:
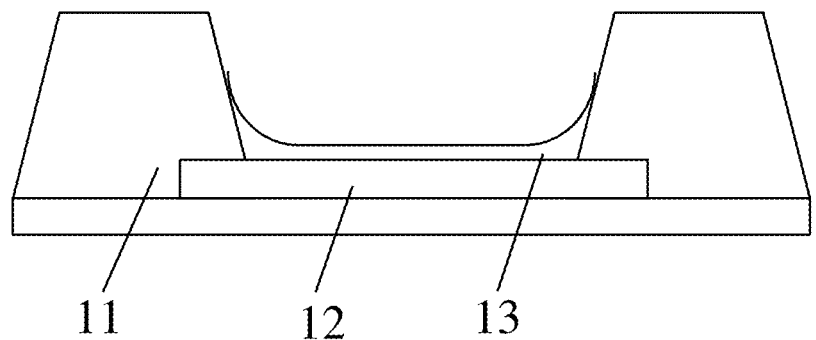
FIG. 2 is a schematic diagram of a morphology of an organic functional layer in a display substrate.

In a manufacture process of the display substrate, for example, an organic functional layer of a light-emitting element is formed by an inkjet printing. After a liquid droplet 13 drips during the inkjet printing process, as shown in FIG. 1, outward capillary flow 1 and inward Marangoni flow 2 occur during a drying process. In general, the outward capillary flow 1 is stronger than the inward Marangoni flow 2. As shown in FIG. 2, in the scenario where the liquid of an organic functional material is formed in a pixel definition layer 11 and on a first electrode 12, due to the above-mentioned flow of the liquid, a morphology of the liquid after the liquid 1041 is dried tends to be uneven, for example, a thin film (commonly known as "coffee ring") which is thin in its middle portion and thick in its edge portion is formed, so that the morphology of the resultant organic functional layer 13 is uneven, affecting the display effect of the display substrate At least one embodiment of the present disclosure provides a display substrate including a pixel definition layer and a controllable deformation layer; the pixel definition layer includes a plurality of openings for defining a plurality of pixel units; and the controllable deformation layer is on the pixel definition layer, and a horizontal extension of at least a portion of the controllable deformation layer in a direction parallel to the pixel definition layer is controllable.

At least one embodiment of the present disclosure further provides a manufacture method of manufacturing a display substrate, the manufacturing method including: forming a pixel definition layer including a plurality of openings for defining a plurality of pixel units; and forming a controllable deformation layer on the pixel definition layer, a horizontal extension of at least a portion of the controllable deformation layer in a direction parallel to the pixel definition layer is controllable.

The display substrate and the manufacture method thereof in the present disclosure will be described below by several specific examples.

Figure 3:
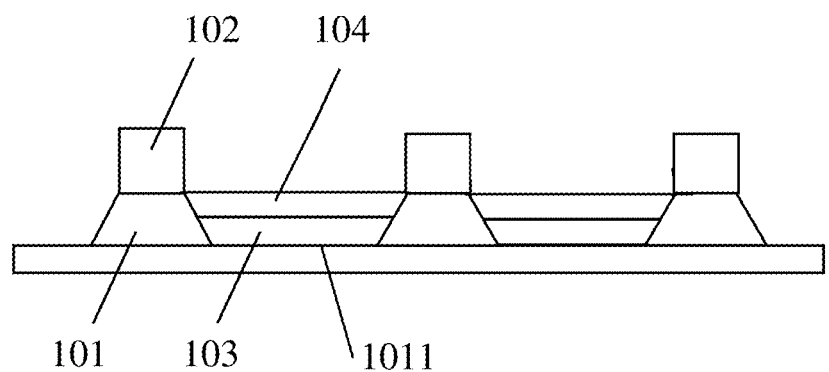
FIG. 3 is a schematic diagram of a display substrate provided by some embodiments of the present disclosure.

At least one embodiment of the present disclosure provides a display substrate, and FIG. 3 shows a partial cross-sectional schematic diagram of the display substrate. As shown in FIG. 3, the display substrate includes a pixel definition layer 101 and a controllable deformation layer 102. The pixel definition layer 101 includes a plurality of openings 1011 for defining a plurality of pixel units; and the controllable deformation layer 102 is on the pixel definition layer 101, and at least a portion of the controllable deformation layer 102 is capable of extending horizontally in a direction parallel to the pixel definition layer 101 (horizontal direction in FIG. 3), and the horizontal extension of the at least portion of the controllable deformation layer 102 is controllable. For example, whether or not the controllable deformation layer 102 is extended horizontally or a size of the horizontal extension is controllable.

The horizontal extension herein represents that the at least portion of the controllable deformation layer may protrude along a direction towards the openings.

For example, the horizontal extension of the controllable deformation layer 102 is controllable, which includes that: the controllable deformation layer 102 may be controlled to realize the horizontal extension, or may be controlled to withdraw the horizontal extension and recover to an initial state, or may be controlled to realize the horizontal extension in a preset range. For example, the range of the horizontal extension may be 10%, 20% of the initial size, etc., and those skilled in the art can select according to requirements. For example, the initial size of the controllable deformation layer 102 in a horizontal direction is 1 μm, the horizontal extension is 0.1 μm, that is, a size of the controllable deformation layer 102 after horizontal extension is 1.1 μm.

For example, after the controllable deformation layer 102 extends horizontally, a cross section of the controllable deformation layer 102 in a direction perpendicular to a plane in which the pixel definition layer 101 is located, may have a shape of being wide at a top and narrow at a bottom.

Figure 4:
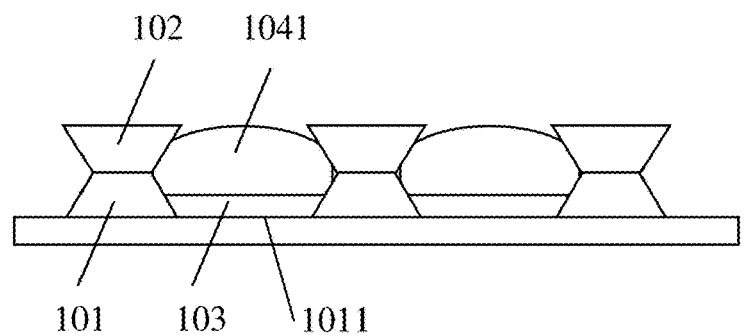
FIG. 4 is a schematic diagram of a controllable deformation layer after deformation in a display substrate provided by some embodiments of the present disclosure.

For example, in an example, as shown in FIG. 4, the cross section of the controllable deformation layer 102 after extending horizontally has a shape of an inverted trapezoid that is narrower on a side of the pixel definition layer 101. Thus, in the manufacture process of the display substrate, in the scenario that the liquid 1041 of the organic functional material is formed in an opening 1011 of the pixel definition layer 101, the horizontal extension of the controllable deformation layer 102 will exert a force on the liquid 1041 to promote the inward Marangoni flow of the liquid 1041 and inhibit the outward capillary flow of the liquid 1041, therefore facilitating the formation of the organic functional layer 104 with uniform morphology after the liquid 1041 is dried, as shown in FIG. 3. As a result, the display substrate has better display effect.

For example, in some embodiments, a material of the controllable deformation layer 102 includes a photo-induced deformation material. For example, the photo-induced deformation material includes azobenzene, benzospiropyran, copolymer containing cinnamic acid group, or polyethylene polymer, etc. For example, in some examples, the material of the controllable deformation layer 102 includes polyimide containing azobenzene, or polysiloxane containing azobenzene, polyimide containing benzospiropyran, chlorinated polyethylene, propionyl-cinnamoyl-ethylene diester copolymer, crosslinked liquid crystal polymer containing groups, such as azobenzene, ralopyran, diarylethylene or stilbene, etc., and the like.

For example, in the scenario that the material of the controllable deformation layer 102 includes a photo-induced deformation material, the horizontal extension of the controllable deformation layer 102 may be realized by irradiating the controllable deformation layer 102 with first light. For example, the horizontal extension of the controllable deformation layer 102 may be withdrawn by removing the first light or irradiating the controllable deformation layer 102 with second light, a wavelength range of the second light is different from a wavelength range of the first light.

It should be noted that in the embodiment of the present disclosure, the horizontal extension of the controllable deformation layer is withdrawn, which represents that the horizontal extension of the controllable deformation layer disappears and the controllable deformation layer recovers to the initial state, that is, the controllable deformation layer recovers to an initial size.

For example, in some examples, the first light may be ultraviolet light, such as ultraviolet light having a wavelength range of 200 nm to 380 nm, such as ultraviolet light having a wavelength of 254 nm, 308 nm, or 360 nm; for example, the second light may be visible light having a wavelength range of 380 nm to 780 nm.

Figure 5:
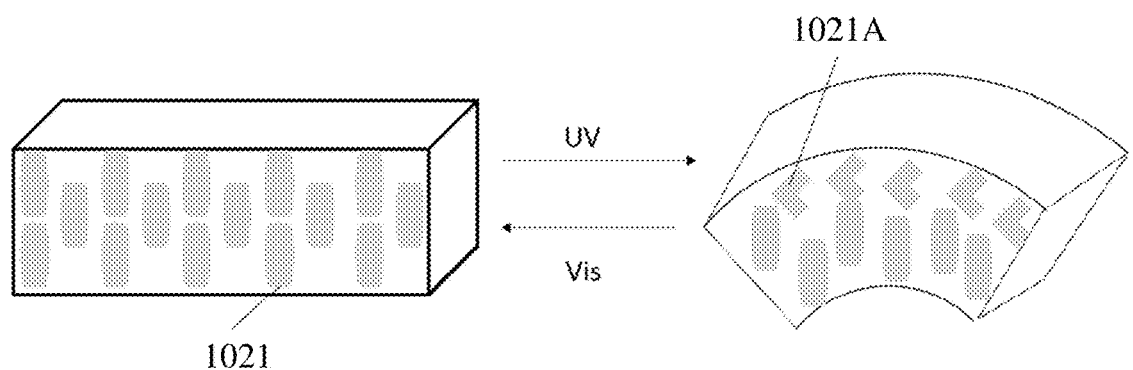
FIG. 5 is a schematic diagram of a deformation principle of a controllable deformation layer in a display substrate provided by some embodiments of the present disclosure.

For example, in an example, the material of the controllable deformation layer 102 includes azobenzene, and photons may be absorbed by azobenzene groups on a surface of the controllable deformation layer 102, because the azobenzene groups have high molar absorptivity. As shown in FIG. 5, in the scenario that an orientation of an azobenzene unit 1021 is perpendicular to a surface of the pixel definition layer 101 (i.e., a vertical direction in the figure), after the ultraviolet light (UV) irradiates the controllable deformation layer 102, the azobenzene unit on the surface of the controllable deformation layer 102 is vertically bent to present a bent state 1021A, thereby causing isotropic expansion on the surface of the controllable deformation layer 102, and further causing horizontal extension of the controllable deformation layer 102. In the scenario that the controllable deformation layer 102 in the horizontal extension state is irradiated by visible light (Vis), the azobenzene unit on the surface of the controllable deformation layer 102 recovers to the initial state, and the azobenzene units recovers to an orderly arrangement in the controllable deformation layer 102, so that the controllable deformation layer 102 also recovers to the initial state.

For example, in other embodiments, the wavelength range of the first light and the wavelength range of the second light may be selected according to the specific type and property of the selected photo-induced deformation material, and the embodiments of the present disclosure are not specifically limited thereto.

For example, in other embodiments, the material of the controllable deformation layer 102 comprises a magnetostrictive material. For example, in an example, the controllable deformation layer 102 comprises a resin polymer material containing terbium-dysprosium-iron rare earth giant magnetostrictive particles. The resin polymer material has good magnetostrictive properties and enables the controllable deformation layer 102 to be controlled to have sufficient amount of horizontal extension.

For example, in the scenario that the material of the controllable deformation layer 102 includes a magnetostrictive material, the horizontal extension of the controllable deformation layer 102 may be realized by applying a magnetic field to the controllable deformation layer 102. For example, the horizontal extension of the controllable deformation layer 102 may be withdrawn by removing the magnetic field applied to the controllable deformation layer 102, that is, after the magnetic field is not applied to the controllable deformation layer 102, the horizontal extension of the controllable deformation layer disappears and recovers to its initial state. For example, the magnetic field may be generated by arranging electromagnets or permanent magnets or the like above the controllable deformation layer 102, in order to control the horizontal extension of the controllable deformation layer 102.

For example, a thickness of the controllable deformation layer 102 (i.e., the size of the controllable deformation layer 102 in a direction perpendicular to the plane in which the pixel definition layer 101 is located) may be ranged from 0.5 μm to 1.5 μm, for example, 0.8 μm, 1 μm, 1.2 μm, or the like. For example, a thickness of the pixel definition layer 101 (i.e., a size of the pixel definition layer 101 in a direction perpendicular to the plane in which the pixel definition layer 101 is located) may be ranged from 1 μm to 2 μm, for example, 1.2 μm, 1.5 μm, 1.8 μm, or the like. Under these circumstances, in the manufacture process of the display substrate, a height of the liquid formed in the pixel definition layer 101 is greater than a height of the pixel definition layer 101, so that the horizontal extension of the controllable deformation layer 102 exerts sufficient force on the liquid in the pixel definition layer 101, thereby facilitating the liquid in the pixel definition layer 101 to form a uniform film after the liquid is dried. For example, in an example, the thickness of the controllable deformation layer 102 is selected to be about 1 μm, and the thickness of the pixel definition layer 101 is also selected to be about 1 μm.

For example, in some embodiments, the size of the horizontal extension of the controllable deformation layer 102 is controllable. For example, in the scenario that the material of the controllable deformation layer 102 is a photo-induced deformation material, the size of the horizontal extension of the controllable deformation layer 102 is controlled by changing an irradiation duration, or light intensity, or both the irradiation duration and the light intensity of the first light. For example, in some examples, in order to enable the controllable deformation layer 102 to extend horizontally, the light intensity of the first light is set in a range of 20 mw/cm$^2$-200 mw/cm$^2$ and the irradiation duration is in a range of 5 s-35 s. In this situation, a horizontal extension ratio of the controllable deformation layer 102 (a ratio of a horizontally extending length of the controllable deformation layer 102 to an initial length of the controllable deformation layer 102) can reach about 5%-30%.

For example, in the scenario that the material of the controllable deformation layer 102 is a magnetostrictive material, the size of the horizontal extension of the controllable deformation layer 102 is controlled by changing an acting duration of the magnetic field, or intensity of a magnetic field, or both the acting duration and the intensity of the magnetic field. For example, in some examples, the intensity of the magnetic field strength applied to the controllable deformation layer 102 is set in a range of 100 KA/m~600 KA/m, and the acting duration of the magnetic field is set in a range of 30 s~120 s. In this situation, a magnetostrictive coefficient of the controllable deformation layer 102 (the ratio of the horizontally extending length of the controllable deformation layer 102 to the initial length of the controllable deformation layer 102) can reach about 800 PPM~6000 PPM.

Appropriate control parameters can be selected according to the specific material of the controllable deformation layer 102 to control the horizontal extension degree of the controllable deformation layer 102, thereby controlling a magnitude of the force applied by the controllable deformation layer 102 on the liquid in the pixel definition layer 101.

For example, in the scenario that the controllable deformation layer 102 is horizontally extended by applying the ultraviolet irradiation or the magnetic field or the like above the display substrate, the cross section of the controllable deformation layer 102 after extending horizontally is easily formed into an inverted trapezoid that is narrower on the side of the pixel definition layer 101, because the material of the controllable deformation layer 102 closer to a position where the ultraviolet irradiation or the magnetic field is applied is deformed more, By controlling the intensity of the ultraviolet irradiation or the application of the magnetic field, a surface of the controllable deformation layer 102 in contact with the pixel definition layer 101 hardly generates deformation, so the controllable deformation layer 102 remains in a bonded state with the pixel definition layer 101 without generating offset. In addition, the pixel definition layer 101 generally comprises an organic insulating material, such as polyimide (PI), etc. In this scenario, the contact between the controllable deformation layer 102 and the pixel definition layer 101 can generate strong intermolecular bonding force, which further avoids the offset between the controllable deformation layer 102 and the pixel definition layer 101.

The display substrate provided by the embodiment of the present disclosure comprises a controllable deformation layer. In the manufacture process of the display substrate, the controllable deformation layer can exert acting force on the liquid of the organic functional material in the pixel definition layer in the drying process by controlling the horizontal extension of the controllable deformation layer, so as to promote the inward Marangoni flow of the liquid and inhibit the outward capillary flow of the liquid, so that the liquid can form the organic functional layer with uniform morphology after the liquid is dried, and further increases the display quality of the display substrate.

At least one embodiment of the present disclosure provides a manufacture method of manufacturing a display substrate, the manufacturing method includes: forming a pixel definition layer, the pixel definition layer including a plurality of openings for defining a plurality of pixel units; and forming a controllable deformation layer on the pixel definition layer. At least a portion of the controllable deformation layer extends horizontally in a direction parallel to the pixel definition layer, and the horizontal extension thereof is controllable.

Next, the manufacture method of manufacturing the display substrate provided by some embodiments of the present disclosure will be described in detail with reference to FIGS. 6A to 6G.

Forming the display substrate generally includes: forming a pixel drive circuit on a base substrate, and then forming a light-emitting element, such as an organic light-emitting diode (OLED), etc. The pixel drive circuit may adjust a light-emitting state of the light-emitting element, thereby adjusting a display gray scale of the display substrate. The pixel drive circuit includes, for example, a plurality of thin film transistors (switching transistors, drive transistors, etc.), capacitors, gate lines, data lines, etc. The method of forming the pixel drive circuit may refer to conventional techniques, and the embodiments of the present disclosure are not limited thereto. After components including a drive circuit are formed, the light-emitting element OLED is formed. OLED includes an anode, a cathode, and an organic functional layer between the anode and the cathode. The organic functional layer includes a light-emitting layer, and in some embodiments, the organic functional layer further includes one or more of an electron injection layer, an electron transport layer, a hole injection layer, and a hole transport layer, and the embodiments of the present disclosure are not limited thereto. The following mainly introduces the process of forming the light-emitting element OLED on the display substrate.

Figure 6A:
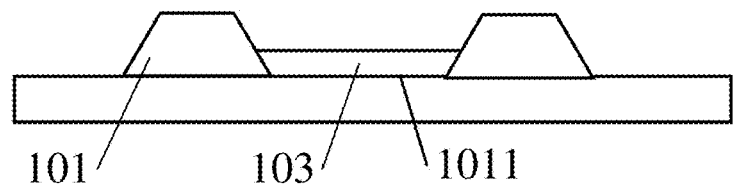
FIGS. 6A-6G are schematic diagrams of a display substrate provided by some embodiments of the present disclosure in a manufacture process.

For example, as shown in FIG. 6A, the anode 103 of the OLED and the pixel definition layer 101 are first formed. For example, a material of the anode 103 includes metal oxides, such as indium tin oxide (ITO), indium zinc oxide (IZO), and the like. For example, an anode material layer may be formed on the base substrate on which the pixel drive circuit has been formed by a magnetron sputtering method or the like, and then the anode 103 may be formed by performing a single patterning process on the anode material layer. For example, the single patterning process includes photoresist coating, exposure, development, etching and other processes, and the embodiments of the present disclosure are not specifically limited to this scenario.

For example, after the anode 103 is formed, the pixel definition layer 101 is formed. For example, the material of the pixel definition layer 101 includes an organic insulation material, such as polyimide (PI) or the like. For example, a pixel definition material layer may be formed on the anode 103 by coating or the like, and the pixel definition layer 101 is formed by performing a single patterning process on the pixel definition material layer. The pixel definition layer 101 is used to define the plurality of pixel units, each pixel unit including a light-emitting element OLED. For example, a thickness of the pixel definition layer 101 is from 1 μm to 2 μm, for example, 1.2 μm, 1.5 μm, 1.8 μm, or the like. The pixel definition layer 101 formed by the patterning process includes a plurality of openings 1011 that expose the anode 103, respectively.

Figure 6B:
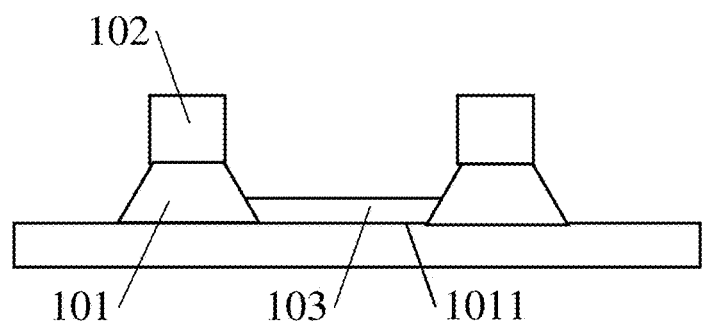

For example, as shown in FIG. 6B, after the pixel definition layer 101 is formed, the controllable deformation layer 102 is formed on the pixel definition layer 101. For example, forming the controllable deformation layer 102 includes: forming a deformation material layer on the pixel definition layer 101 by coating or the like, and then forming the controllable deformation layer 102 by performing a single patterning process on the deformation material layer. For example, a thickness of the controllable deformation layer 102 is in a range of 0.5 μm~1.5 μm, for example, 0.8 μm, 1 μm, 1.2 μm, or the like.

For example, in some embodiments, the material of the controllable deformation layer 102 includes a photo-induced deformation material, such as azobenzene, benzospiropyran, cinnamic copolymer containing cinnamic acid groups, polyethylene polymer, or the like. For example, in other embodiments, the material of the controllable deformation layer 102 includes a magnetostrictive material, such as a resin polymer material containing terbium-dysprosium-iron rare earth giant magnetostrictive particles, and the like. Of course, the controllable deformation layer 102 may also include other controllable deformation materials, and the embodiments of the present disclosure are not specifically limited to this scenario.

Alternatively, in some examples, the controllable deformation layer and the pixel definition layer may be formed together in a single patterning process. For example, the pixel definition material layer and the deformation material layer are sequentially formed, and then the pixel definition layer 101 and the controllable deformation layer 102 are formed by performing the single patterning process on the pixel definition material layer and the deformation material layer. The embodiment of the present disclosure is not limited to the specific process of forming the controllable deformation layer.

Figure 6C:
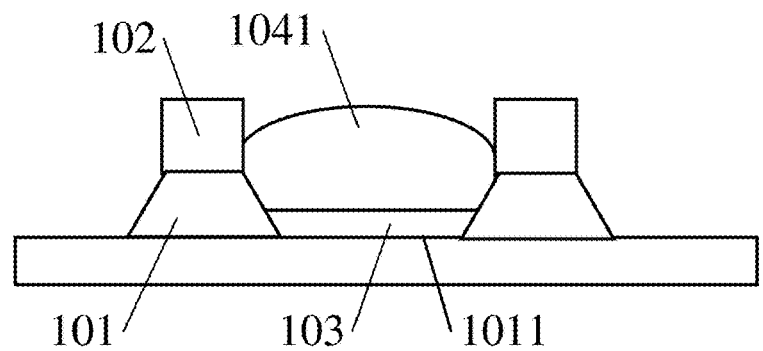

For example, as shown in FIG. 6C, after the controllable deformation layer 102 is formed, the organic functional layer is formed in the plurality of openings 1011 of the pixel definition layer 101.

Figure 6D:
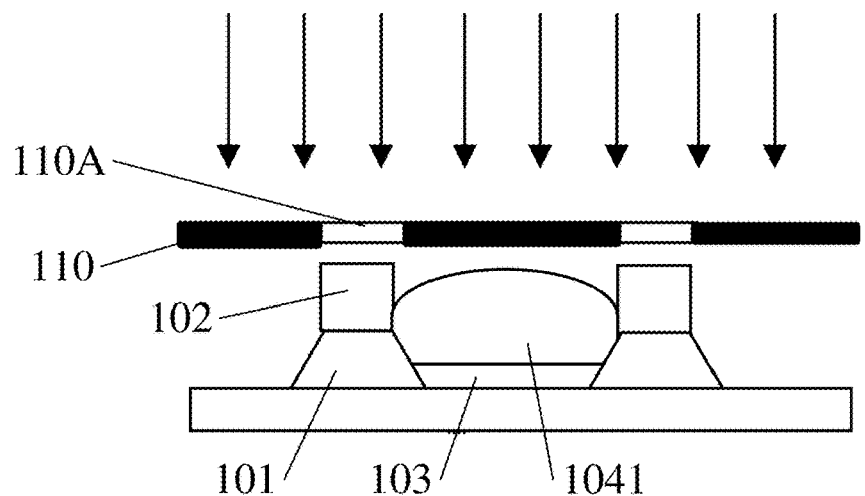
Figure 6E:
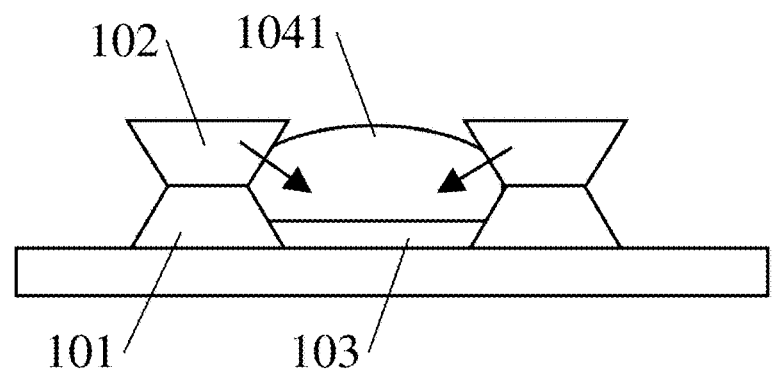

For example, forming the organic functional layer includes: filling the openings 1011 with a liquid material. For example, the liquid 1041 of the organic functional material is formed in the openings 1011 of the pixel definition layer 101 by inkjet printing, and a height of the liquid 1041 formed by inkjet printing is greater than a height of the pixel definition layer 101. As shown in FIG. 6D, while drying the liquid 1041, a first control is applied to the controllable deformation layer 102 so that the controllable deformation layer 102 extends horizontally along a direction towards the openings 1011. For example, as shown in FIG. 6E, after the controllable deformation layer 102 extends horizontally, the cross section of the controllable deformation layer 102 has a shape with a large top and a small bottom, for example, the cross section of the controllable deformation layer 102 is in a shape of an inverted trapezoid that is narrower on a side of the pixel definition layer 101. In this situation, the controllable deformation layer 102 applies force to the liquid 1041 while the controllable deformation layer 102 extends horizontally, so as to promote the inward Marangoni flow of the liquid 1041 and inhibit the outward capillary flow of the liquid 1041, as a result, the morphology of the liquid 1041 is more uniform after the liquid 1041 is dried.

For example, applying the first control to the controllable deformation layer 102 includes: controlling a size of the horizontal extension of the controllable deformation layer by changing at least one of a duration and an intensity of the first control. Appropriate control parameters may be selected according to the specific material of the controllable deformation layer 102 to control the horizontal extension degree of the controllable deformation layer 102, thereby controlling the magnitude of the force applied by the controllable deformation layer 102 on the liquid in the pixel definition layer 101.

For example, in the scenario that the material of the controllable deformation layer 102 is a photo-induced deformation material, the first control is a first light irradiation. In this situation, the extent of the horizontal extension of the controllable deformation layer 102 can be controlled by changing the irradiation duration, the light intensity or both the irradiation duration and the light intensity of the first light irradiation. For example, in some examples, the first light irradiation is ultraviolet light irradiation, such as ultraviolet light irradiation with a wavelength range of 200 nm to 380 nm, such as ultraviolet light irradiation with a wavelength of 254 nm, 308 nm, or 360 nm.

For example, in some examples, the light intensity of the first light irradiation is selected to be 20 mw/cm$^2$~200 mw/cm$^2$, and the irradiation duration is selected to be 5 s~35 s. In this situation, the horizontal elongation of the controllable deformation layer 102 can reach about 5%~30%. Appropriate irradiation duration and light intensity can be selected according to actual production requirements.

For example, in the scenario the material of the controllable deformation layer 102 is a magnetostrictive material, the first control is a magnetic field. In this situation, the extent of the horizontal extension of the controllable deformation layer 102 can be controlled by changing the acting duration of the magnetic field, the intensity of the magnetic field, or both the acting duration and the intensity of the magnetic field. For example, in some examples, the intensity of the magnetic field applied to the controllable deformation layer 102 is selected to be 100 KA/m~600 KA/m, and the acting duration of the magnetic field is selected to be 30 s~120 s. In this situation, the magnetostrictive coefficient of the controllable deformation layer 102 can reach about 800

PPM~6000 PPM. Appropriate intensity of the magnetic field and the acting duration of the magnetic field can be selected according to actual production requirements.

For example, in the example shown in FIG. 6D, the material of the controllable deformation layer 102 includes the photo-induced deformation material, such as azobenzene, and in this situation, the first control includes irradiating the controllable deformation layer 102 with ultraviolet light through a mask 110. For example, a light-transmitted region 110A of the mask 110 exposes the controllable deformation layer 102, so that ultraviolet light does not irradiate other portions of the display substrate to avoid adverse effects.

Figure 7:
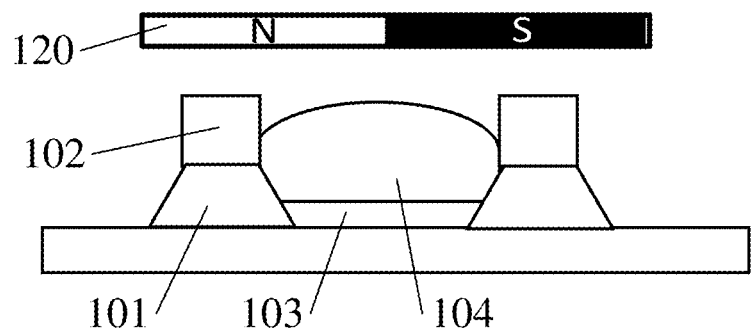
FIG. 7 is a schematic diagram of a display substrate provided by some embodiments of the present disclosure in another manufacture process.

For example, in another example, as shown in FIG. 7, in the scenario that the material of the controllable deformation layer 102 includes a magnetostrictive material, the first control includes arranging a magnetic field generation device 120 above the controllable deformation layer 102 and controlling the magnetic field generation device 120 to generate the magnetic field. For example, the magnetic field generation device 120 is a permanent magnet or an electromagnet. For example, in the scenario that the magnetic field generation device 120 employs electromagnets, the horizontal extension of the controllable deformation layer 102 can be controlled by controlling the magnitude of a current which is energize the electromagnets, or a duration of the current, or both the magnitude and duration of the current.

For example, a magnetostrictive direction of the magnetostrictive material is related to a direction of the applied magnetic field and a type of magnetostrictive material, so the applied magnetic field direction may be selected according to the type of magnetostrictive material and the required horizontal extension direction of the controllable deformation layer 102. For example, the controllable deformation layer 102 includes the resin polymer material containing terbium-dysprosium-iron rare earth giant magnetostrictive particles. In the scenario that the magnetic field is applied by the magnetic field generation device 120, the magnetic field generation device 120 applies a magnetic field parallel to the horizontal extension direction to the controllable deformation layer 102, this is because a magnetic extension direction of the resin polymer material containing terbium-dysprosium-iron rare earth giant magnetostrictive particles is substantially the same as the magnetic field direction. For example, two magnetic poles of the magnetic field generation device 120 are placed on and parallel to the surface of the display substrate above the controllable deformation layer 102, and generate the magnetic field parallel to the horizontal extension direction of the controllable deformation layer 102, thereby applying a uniform magnetic field to the controllable deformation layer 102 and enabling the controllable deformation layer 102 to horizontally extend along a direction towards the openings of the pixel definition layer.

Illustratively, FIG. 7 only shows a magnetic field generation device in an exemplary form. In the scenario that the controllable deformation layer 102 includes the resin polymer material containing terbium-dysprosium-iron rare earth giant magnetostrictive particles, the embodiment of the present disclosure does not limit the direction and mode of the magnetic field generation device, as long as the magnetic field generation device can generate a deformation direction parallel to the controllable deformation layer, for example, a magnetic field or a magnetic field component in the horizontal extension direction.

For example, in other examples, the magnetostrictive material included in the controllable deformation layer 102 may also be a resin polymer material containing rare earth-iron compounds, such as TbFe2 (terbium iron), SmFe2 (samarium iron), DyFe2 (dysprosium iron), HoFe2 (holmium iron), or the like. In this situation, in the scenario that the magnetic field generation device 120 is used to apply the magnetic field, the position of the magnetic field generation device 120 may be adjusted according to the characteristics of the material and the required extension direction. The embodiment of the present disclosure does not specifically limit the type of magnetostrictive material and the application mode of the magnetic field, as long as the controllable deformation layer 120 can be horizontally extended after the magnetic field is applied to the controllable deformation layer 120.

For example, in an example, the magnetic field generation device is an electromagnetic material layer formed on the controllable deformation layer 102, and the electromagnetic material layer forms a magnetic field applied to the controllable deformation layer 102, so as to enable to the controllable deformation layer 102 to extend horizontally. and the arrangement mode of the electromagnetic material layer and the relative position relationship with the controllable deformation layer can be set according to the type of magnetostrictive material, so long as the controllable deformation layer can extend horizontally after the magnetic field is applied to the controllable deformation layer 120.

Figure 6F:
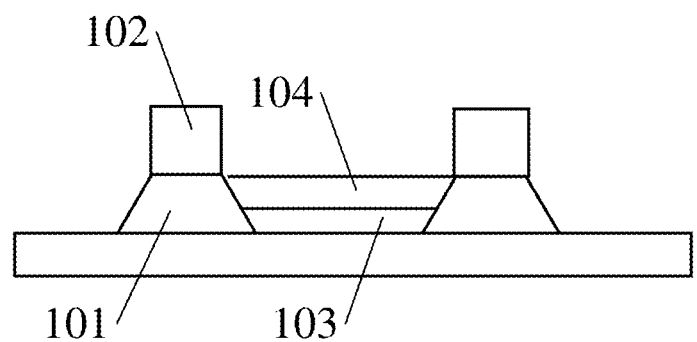

As shown in FIG. 6F, the liquid 1041 of the organic functional material formed in the opening 1011 of the pixel definition layer 101 is dried to form the organic functional layer 104 which has a uniform morphology.

For example, after the completion of drying the liquid 1041, the controllable deformation layer 102 is controlled to withdraw the horizontal extension of the controllable deformation layer 102.

For example, in the scenario that the material of the controllable deformation layer 102 is a photo-induced deformation material, withdrawing the horizontal extension of the controllable deformation layer 102 includes: removing the first light irradiation or applying a second light irradiation, a wavelength range of the second light irradiation is different from a wavelength range of the first light irradiation to the controllable deformation layer 102. For example, in the above example, the first light irradiation is ultraviolet light irradiation, and the second light irradiation is visible light irradiation; the wavelength range of the visible light is ranged from 380 nm to 780 nm. For example, in the scenario that the material of the controllable deformation layer 102 is magnetostrictive material, withdrawing the horizontal extension of the controllable deformation layer 102 includes: removing the magnetic field.

For example, in an example corresponding to the example as shown in FIG. 6D, withdrawing the horizontal extension of the controllable deformation layer 102 includes: removing the ultraviolet light or irradiating the controllable deformation layer 102 with the visible light through the mask 110 to withdraw the horizontal extension of the controllable deformation layer 102. In the example as shown in FIG. 7, withdrawing the horizontal extension of the controllable deformation layer 102 includes: removing the magnetic field. For example, stopping energizing the electromagnet to withdraw the horizontal extension of the controllable deformation layer 102. Next, for example, a manipulator is used to take the display substrate under the electromagnet away and fix it onto the corresponding equipment to carry out subsequentially manufacture processes.

Figure 6G:
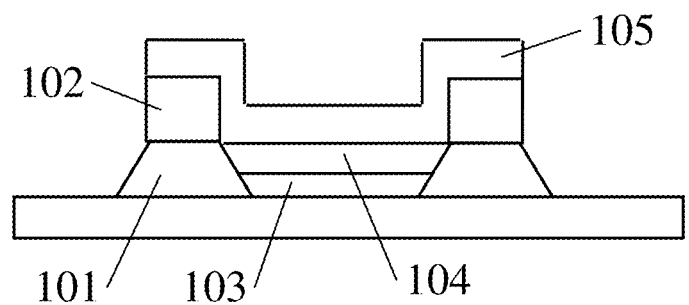

For example, as shown in FIG. 6G, the cathode 105 is formed on the organic functional layer 104, after the organic functional layer 104 is formed and the horizontal extension of the controllable deformation layer 102 is withdrawn. For example, the material of the cathode includes a metal material, such as copper, copper alloy, aluminum, aluminum alloy, magnesium, magnesium alloy, and the like. For example, a cathode material layer may be formed on the organic functional layer 104 by a magnetron sputtering method or the like, and then the cathode 105 may be formed by performing a single patterning process on the cathode material layer.

For example, after the cathode 105 is formed, the manufacture method of the display substrate further includes: forming structures, such as insulation layers, spacers, encapsulation layers, etc. The method of forming these structures may refer to conventional technologies, and the embodiments of the present disclosure are not limited thereto.

It should be noted that in the present disclosure, the horizontal extension of the controllable deformation layer is controllable. While extending horizontally, the controllable deformation layer may also have other forms of deformation, such as elongation in a height direction, bending, etc., but the present disclosure is not limited, as long as it ensures that the horizontal extension occurs and the deformation is retractable.

In the manufacture method of the display substrate provided by the embodiment of the present disclosure, the controllable deformation layer is formed. Thus, by controlling the horizontal extension of the controllable deformation layer in the manufacture process of the display substrate, the controllable deformation layer can exert acting force on the liquid of the organic functional material in the pixel definition layer during the drying process, which can promote the inward Marangoni flow of the liquid and inhibit the outward capillary flow of the liquid. After being dried, the liquid forms an organic functional layer with uniform morphology, which further improves the display quality of the display substrate.

The following points need to be explained:

(1) The drawings of the embodiments of the present disclosure only refer to the structures related to the embodiments of the present disclosure, and other structures may refer to the general design.

(2) For the sake of clarity, in the drawings for describing embodiments of the present disclosure, the thickness of layers or regions is enlarged or reduced, i.e., the drawings are not drawn to actual scale. It will be understood that when an element, such as a layer, film, region or substrate is referred to as being "on" or "under" another element, the element may be "directly" on "or" under "the other element or intervening elements may be present.

(3) In case of no conflict, the embodiments of the present disclosure and the features in the embodiments can be combined with each other to obtain new embodiments.

What has been described above merely is specific implementations of the present disclosure, but the protective scope of the present disclosure is not limited to these scenarios. Any person familiar with the technical field can easily think of changes or substitutions within the technical scope of the present disclosure, and should be covered within the scope of protection of the present disclosure. Therefore, the protective scope of the present disclosure is determined by the appended claims.

What is claimed is:

1. A display substrate, comprising:
    a pixel definition layer, comprising a plurality of openings for defining a plurality of pixel units; and
    a controllable deformation layer on the pixel definition layer, a horizontal extension of at least a portion of the controllable deformation layer in a direction parallel to the pixel definition layer being controllable,
    wherein the horizontal extension is realized by irradiating the controllable deformation layer with first light, and
    wherein the horizontal extension is withdrawn by removing the first light or irradiating the controllable deformation layer with second light, wherein a wavelength range of the second light is different from a wavelength range of the first light.

2. The display substrate according to claim 1, wherein, after the controllable deformation layer extends horizontally, a cross section of the controllable deformation layer in a direction perpendicular to the pixel definition layer is an inverted trapezoid that is narrower on a side of the pixel definition layer.

3. The display substrate according to claim 1, wherein a material of the controllable deformation layer comprises a photo-induced deformation material.

4. The display substrate according to claim 3, wherein the photo-induced deformation material comprises azobenzene, benzospiropyran, copolymer containing cinnamic acid groups, or polyethylene polymer.

5. The display substrate according to claim 1, wherein a thickness of the controllable deformation layer is ranged from 0.5 μm to 1.5 μm.

6. A manufacturing method of a display substrate, comprising:
    forming a pixel definition layer, the pixel definition layer comprising a plurality of openings for defining a plurality of pixel units;
    forming a controllable deformation layer on the pixel definition layer, a horizontal extension of at least a portion of the controllable deformation layer in a direction parallel to the pixel definition layer being controllable;
    applying a first control to the controllable deformation layer, so that the controllable deformation laver extends horizontally along a direction towards the plurality of openings; and
    controlling the controllable deformation layer to withdraw the horizontal extension of the controllable deformation layer,
    wherein the first control is first light irradiation, and the controlling the controllable deformation layer to withdraw the horizontal extension of the controllable deformation layer comprises:
    removing the first light irradiation or applying second light irradiation to the controllable deformation layer, a wavelength range of the second light irradiation being different from a wavelength range of the first light irradiation.

7. The manufacturing method according to claim 6, further comprising:
    filling the plurality of openings with a liquid material; and
    drying the liquid material, and at the same time applying the first control to the controllable deformation layer.

8. The manufacturing method according to claim 7, wherein after the drying the liquid material,
    controlling the controllable deformation layer to withdraw the horizontal extension of the controllable deformation layer.

9. The manufacturing method according to claim 8, wherein the applying the first control to the controllable deformation layer comprises:

controlling a size of the horizontal extension of the controllable deformation layer by changing at least one of a duration and an intensity of the first control.

10. The manufacturing method according to claim 9, wherein a material of the controllable deformation layer is a photo-induced deformation material,
    wherein the controlling the size of the horizontal extension of the controllable deformation layer by changing the at least one of the duration and the intensity of the first control comprises:
    controlling the size of the horizontal extension of the controllable deformation layer by changing an irradiation duration, a light intensity, or both the irradiation duration and the light intensity of the first light irradiation.

11. The manufacturing method according to claim 10, wherein the first light irradiation is ultraviolet light irradiation and the second light irradiation is visible light irradiation.

12. The manufacturing method according to claim 10, wherein the light intensity of the first light irradiation is ranged from 20 mw/cm$^2$ to 200 mw/cm$^2$, and the irradiation duration is ranged from 5 s to 35 s.

13. A display substrate, comprising:
    a pixel definition layer, comprising a plurality of openings for defining a plurality of pixel units; and
    a controllable deformation layer on the pixel definition layer, a horizontal extension of at least a portion of the controllable deformation layer in a direction parallel to the pixel definition layer being controllable,
    wherein a material of the controllable deformation layer comprises a magnetostrictive material.

14. The display substrate according to claim 13, wherein the controllable deformation layer comprises a resin polymer material containing terbium-dysprosium-iron rare earth giant magnetostrictive particles.

15. The display substrate according to claim 13, wherein the horizontal extension is realized by applying a magnetic field to the controllable deformation layer.

16. The display substrate according to claim 15, wherein the horizontal extension is withdrawn by removing the magnetic field applied to the controllable deformation layer.

17. A manufacturing method of the display substrate according to claim 13, the method comprising:
    forming the pixel definition layer, the pixel definition layer comprising the plurality of openings for defining the plurality of pixel units; and
    forming the controllable deformation layer on the pixel definition layer, the horizontal extension of at least the portion of the controllable deformation layer in the direction parallel to the pixel definition layer being controllable,
    wherein the material of the controllable deformation layer comprises the magnetostrictive material.

18. The manufacturing method according to claim 17, further comprising:
    applying a first control to the controllable deformation layer, so that the controllable deformation layer extends horizontally along a direction towards the plurality of openings,
    wherein the first control is a magnetic field.

19. The manufacturing method according to claim 18, further comprising:
    controlling the controllable deformation layer to withdraw the horizontal extension of the controllable deformation layer,
    wherein the controlling the controllable deformation layer to withdraw the horizontal extension of the controllable deformation layer comprises:
    removing the magnetic field.

20. The manufacturing method according to claim 18, wherein the applying the first control to the controllable deformation layer comprises:
    controlling a size of the horizontal extension of the controllable deformation layer by changing at least one of a duration and an intensity of the first control,
    wherein the controlling the size of the horizontal extension of the controllable deformation layer by changing the at least one of the duration and the intensity of the first control comprises:
    controlling the size of the horizontal extension of the controllable deformation layer by changing an acting duration of the magnetic field, an intensity of the magnetic field, or both the acting duration and the intensity of the magnetic field,
    wherein the intensity of the magnetic field is ranged from 100 KA/m to 600 KA/m, and the acting duration is from 30 s to 120 s.

* * * * *